United States Patent
Jang et al.

(10) Patent No.: US 10,842,057 B2
(45) Date of Patent: *Nov. 17, 2020

(54) SHIELD CAN ASSEMBLY AND ELECTRONIC DEVICE INCLUDING THE SAME

(71) Applicant: Samsung Electronics Co., Ltd., Gyeonggi-do (KR)

(72) Inventors: Ki-Youn Jang, Gyeonggi-do (KR); Jeong-Ung Kim, Gyeonggi-do (KR); Jung-Je Bang, Gyeongsangbuk-do (KR); Sang-Hyun An, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 227 days.

This patent is subject to a terminal disclaimer.

(21) Appl. No.: 14/302,387

(22) Filed: Jun. 11, 2014

(65) Prior Publication Data
US 2014/0362543 A1 Dec. 11, 2014

(30) Foreign Application Priority Data
Jun. 11, 2013 (KR) .................. 10-2013-0066249

(51) Int. Cl.
*H05K 9/00* (2006.01)
*H05K 1/02* (2006.01)

(52) U.S. Cl.
CPC ........... *H05K 9/0052* (2013.01); *H05K 1/023* (2013.01); *H05K 9/0035* (2013.01)

(58) Field of Classification Search
CPC .... H05K 1/023; H05K 9/0052; H05K 9/0035; H05K 9/0024; H05K 9/0032; H05K 9/0026; H05K 9/0028; H05K 9/0033
(Continued)

(56) References Cited

U.S. PATENT DOCUMENTS 5,577,268 A * 11/1996 Ho .................. H04B 15/02
361/800
5,633,786 A * 5/1997 Matuszewski ....... H05K 9/0032
174/359

(Continued)

FOREIGN PATENT DOCUMENTS

JP 2008263014 A 10/2008
JP 2012182058 A 9/2012
(Continued)

OTHER PUBLICATIONS

Extended European Search Report dated Jun. 5, 2015 in connection with European Patent Application No. 14169710.2; 11 pages.

(Continued)

*Primary Examiner* — Binh B Tran

(57) ABSTRACT

An electronic device includes a printed circuit board (PCB), a first cover disposed to shield a first region of the PCB, and a second cover for shielding a second region which has at least a boundary with the first region. A corresponding boundary portion the first cover and the second cover include at least one protrusion portion and at least one recess portion which are fitted to face each other. Thus, since at least two shielding covers share the single boundary region, the component mounting region of the PCB can be efficiently utilized to thus contribute to slimness of the electronic device.

22 Claims, 6 Drawing Sheets

(58) Field of Classification Search
USPC ......... 174/51, 520, 260, 350, 377, 384, 387; 361/679.01, 679.02, 679.57, 679.58, 734, 361/748, 752, 759, 818, 816; 257/704
See application file for complete search history.

(56) References Cited

U.S. PATENT DOCUMENTS

| | | | |
|---|---|---|---|
| 5,895,844 | A | 4/1999 | Davidson |
| 5,917,708 | A | 6/1999 | Moran et al. |
| 6,377,475 | B1 | 4/2002 | Reis |
| 7,183,498 | B2 | 2/2007 | Ogura et al. |
| 7,506,436 | B2 | 3/2009 | Bachman |
| 7,952,890 | B2 * | 5/2011 | Myers ............... H05K 9/0032 174/350 |
| 7,986,533 | B2 | 7/2011 | Ren et al. |
| 8,355,263 | B2 | 5/2013 | Kim et al. |
| 8,436,256 | B2 | 5/2013 | Kim et al. |
| 8,816,219 | B2 | 8/2014 | Kim |
| 2006/0012969 | A1 | 1/2006 | Bachman |
| 2006/0072292 | A1 | 4/2006 | Ogura et al. |
| 2010/0149780 | A1 * | 6/2010 | Ren ................ H05K 9/0032 361/818 |
| 2011/0094791 | A1 * | 4/2011 | Kim ................ H05K 9/0022 174/377 |
| 2011/0211327 | A1 | 9/2011 | Myers et al. |
| 2013/0008707 | A1 | 1/2013 | Kim |

FOREIGN PATENT DOCUMENTS

| | | |
|---|---|---|
| KR | 10-2002-0086526 | 11/2002 |
| KR | 10-2002-0089526 | 11/2002 |
| KR | 20110045153 A | 5/2011 |

OTHER PUBLICATIONS

Notice of Preliminary Rejection dated Jun. 19, 2015 in connection with Korean Patent Application No. 10-20130066249; 14 pages.
Non-Final Office Action dated Jul. 20, 2015 in connection with U.S. Appl. No. 14/713,940; 23 pages.
Notice of Patent Grant issued for Korean Application No. 10-2013-0066249 dated Feb. 5, 2016, 7 pgs.
U.S. Office Action issued for U.S. Appl. No. 14/713,940 dated Feb. 16, 2016, 26 pgs.
European Examination Report dated Jun. 3, 2016 in connection with European Application No. 14169710.2, 9 pages.
U.S. Appl. No. 14/713,940, "Non-Final Office Action," dated Sep. 7, 2016, pp. 20, publisher United States Patent and Trademark Office, Alexandria, Virginia.
Foreign Communication From a Related Counterpart Application, European Application No. 14169710.2-1803, Summons to Attend Oral Proceedings Pursuant to Rule 115(1) EPC dated Feb. 15, 2017, 8 pages.
U.S. Appl. No. 14/713,940, filed May 15, 2015, Non-Final Office Action dated Jan. 30, 2017, 24 pages.
Final Office Action, dated Nov. 8, 2017, regarding U.S. Appl. No. 14/713,940, 22 pages.
Final Office Action, dated Jan. 22, 2018, regarding U.S. Appl. No. 14/713,940, 24 pages.
European Search Report dated Jun. 13, 2018 in connection with European Patent Application No. 18 15 7446.
Communication pursuant to Article 94(3) EPC dated Jul. 8, 2020 in connection with European Patent Application No. 18 157 446.8, 9 pages.

* cited by examiner

SHIELD CAN ASSEMBLY AND ELECTRONIC DEVICE INCLUDING THE SAME

CROSS-REFERENCE TO RELATED APPLICATION(S) AND CLAIM OF PRIORITY

The present application is related to and claims the benefit under 35 U.S.C. § 119(a) to a Korean patent application filed in the Korean Intellectual Property Office on Jun. 11, 2013, and assigned Serial No. 10-2013-0066249, the entire disclosure of which is hereby incorporated by reference.

TECHNICAL FIELD

The present disclosure relates generally to a shield can assembly. More particularly, the present disclosure relates to an electronic device including a shield can assembly.

BACKGROUND

In general, an electronic device can include a printed circuit board (PCB) of various types as the electronic device's main board. Diverse electronic function groups can be mounted on the PCB for various functions of the electronic device. When the electronic function group operates, it can emit a harmful wave. Hence, an electromagnetic wave emitted by the electronic device is severely restricted.

The electromagnetic wave of the harmful wave is most common, and an electromagnetic compatibility (EMC) test is conducted to test whether the electromagnetic wave is acceptable in the environment.

The EMC test is divided into an electromagnetic interference (EMI) test and an electromagnetic susceptibility (EMS) test, which are strictly regulated due to its harmfulness to the human body. Accordingly, many devices are suggested to prevent in advance the electromagnetic wave in the electronic function group according to the strict regulation of the EMI test.

To shield the electromagnetic wave radiated by the electronic function group on the PCB of the electronic device, a paint is spread using an EMI spray or vacuum deposition or one or more shield cans are mounted to shield one or more electronic function groups on the PCB.

While such methods are redundantly used, the shield can is indispensable. Various methods are suggested to mount the shield can on the PCB, which is largely divided into a mechanical coupling method, a clip-type coupling method, and a frame-type coupling method.

The mechanical coupling method fastens the shield can and the PCB using a plurality of screws. The clip-type coupling method mounts a clip along an outer rim of the shield can to electrically connect with a ground line of the PCB and then secures the shield can to the clip. The frame-type coupling method installs a separate frame to surround the components of the PCB and secures the shield can to the frame.

While the electronic device adds more various functions in response to user's wants, the electronic device's size is miniaturized and slimmed. Hence, the structure for securing the shield can which is indispensible to shield the harmful wave from the electronic function groups is under discussion in many aspects in view of efficient space usage.

SUMMARY

To address the above-discussed deficiencies, it is a primary aspect of the present disclosure to provide a shield can assembly and an electronic device having it.

Another aspect of the present disclosure is to provide a shield can assembly for contributing to slimness by enhancing space usage, and an electronic device having it.

Yet another aspect of the present disclosure is to provide a shield can assembly for mounting more electronic function groups on a PCB, and an electronic device having it.

According to one aspect of the present disclosure, an electronic device includes a printed circuit board (PCB); a first cover disposed to shield a first region of the PCB; and a second cover for shielding a second region which has at least a boundary with the first region. A corresponding boundary portion the first cover and the second cover may include at least one protrusion portion and at least one recess portion which are fitted to face each other. The first cover and the second cover may be disposed to cross their boundary surfaces. The shielding cover may be a shield can be disposed on the PCB of the electronic device.

A portion of the first cover facing the second cover may be formed by alternating one or more protrusion portions and recess portions at regular intervals, and a portion of the second cover facing the first cover may be formed by alternating one or more recess portions and protrusion portions to be fitted with the protrusion portions and the recess portions of the first cover at corresponding positions. Any one of the protrusion portion and the recess portion of the first cover and the second cover may be formed to have a closed end.

The boundary portion of the first cover and the second cover may be formed to have a closed end in either cover.

The first cover and the second cover may include a top surface in a size corresponding to at least the first region and the second region; and a side surface bending along a rim of the top surface to a certain height. At least one side surface of the first and second covers is fitted in the boundary portion. A depth of the fitted first and second covers may be greater than, not greater than, or equal to a thickness of one of the first and second covers.

The electronic device may further include a ground line disposed to be exposed in a top surface of the PCB and having a certain width to form a boundary corresponding to rims of the first and second regions. The electronic device may further include a fixing means secured on the ground line and fixing the first cover and the second cover. The fixing means may be a fixing clip which is disposed at regular intervals in the ground line and comprises a side insertion portion for receiving side surfaces of the first cover and the second cover in a press-fit fashion. The fixing means may be a metal frame which is formed in the same shape as the ground line to a certain height and secured such that side surfaces of the first cover and the second cover are tightly fitted in an inner side surface or an outer side surface. The side surface of the first cover and the second cover may be a plurality of tension ribs spaced at regular intervals, and the tension rib may be formed to press an outer surface into the frame. The frame may be separated into a first frame in a shape corresponding to the first region and a second frame in a shape corresponding to the second region. A boundary portion of the first region and the second region may be integrally formed with, at least partially, the first frame and the second frame.

According to another aspect of the present disclosure, a shield can assembly includes a first cover mounted to shield a first region of a PCB; and a second cover for shielding a second region having at least a boundary with the first region. A corresponding boundary portion the first cover and the second cover may include at least one protrusion portion and at least one recess portion which are fitted to face each other.

According to yet another aspect of the present disclosure, a PCB assembly includes a PCB for mounting a plurality of electronic function groups; a first cover mounted to shield the electronic function group in a first region of the PCB; and a second cover for shielding the electronic function group in a second region having at least a boundary with the first region. A corresponding boundary portion the first cover and the second cover may include at least one protrusion portion and at least one recess portion which are fitted to face each other.

According to still another aspect of the present disclosure, an electronic device includes a PCB for mounting a plurality of electronic function groups; a first region for accommodating part of the electronic function groups; a second region having at least a boundary portion with the first region and accommodating part of the electronic function groups; a boundary line defining the first region and the second region and electrically connected to a ground of the PCB; a first cover of a metal material mounted in the ground line to shield the first region; a second cover of a metal material mounted in the ground line to shield the second region; and a fixing means of a conductive material for securing the first cover and the second cover to the first region and the second region respectively. A corresponding boundary portion the first cover and the second cover may include at least one protrusion portion and at least one recess portion which are fitted to face each other.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of exemplary embodiments of the present disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Hereinafter, an electronic device can be applied to various devices including a Printed Circuit Board (PCB) for mounting a plurality of electronic function groups. For example, the electronic device can employ various devices including a touch screen, that is, various devices such as Personal Digital Assistant (PDA), laptop computer, mobile phone, smart phone, netbook, Mobile Internet Device (MID), Ultra Mobile PC (UMPC), tablet PC, a navigation, and MP3 player.

The PCB can be of, but not limited to, a rigid type or a flexible type. Even when the PCB is not included in the electronic device, the present disclosure is applicable to shield cans for shielding the electronic function group.

Figure 1:
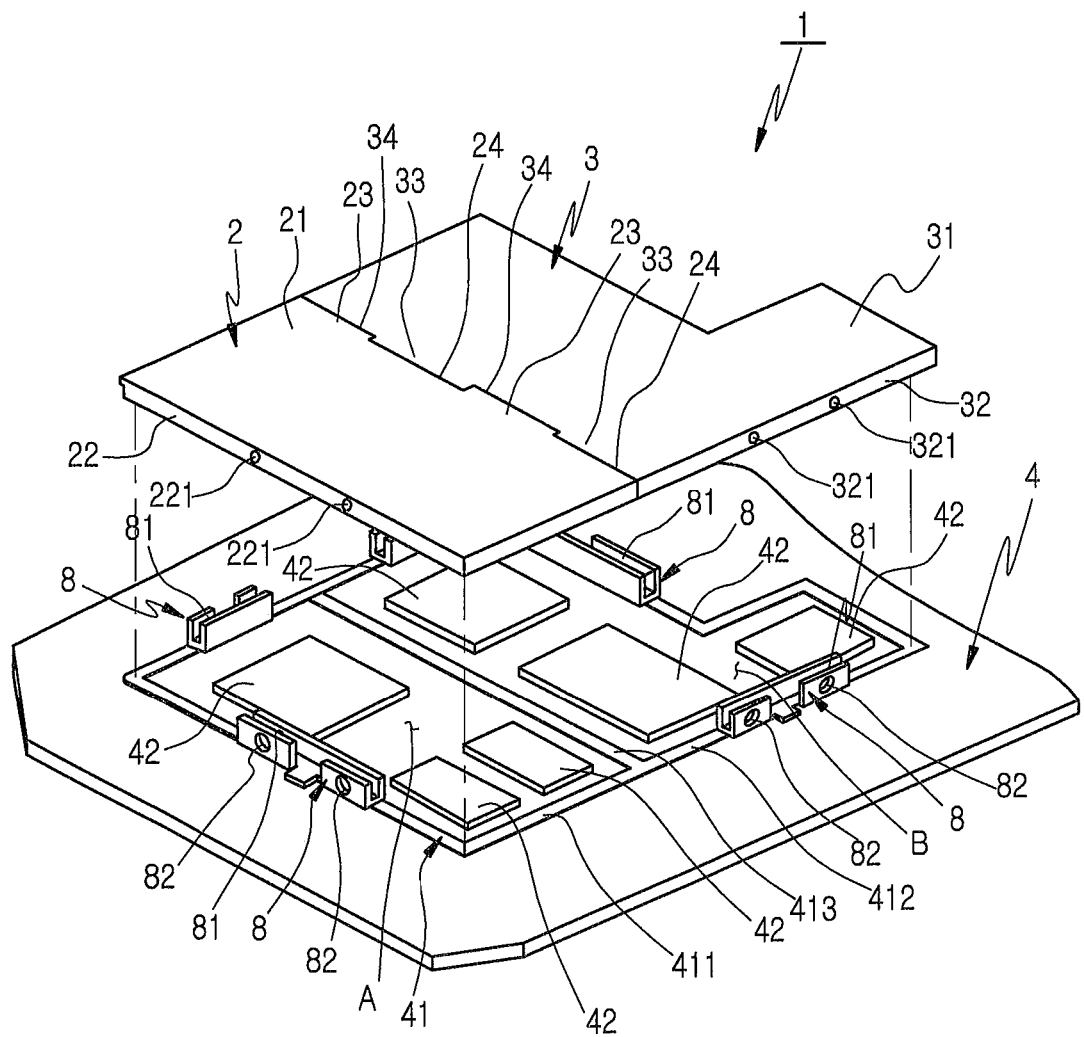
FIG. 1 illustrates an exploded view of a shield can assembly according to various exemplary embodiments of the present disclosure.

Herein, the term 'engage' can indicate that a protrusion formed in a first object is fit into a recess portion formed in a second object to share the facing boundary portion. FIG. 1 illustrates an exploded view of a shield can assembly according to various exemplary embodiments of the present disclosure. While two shielding covers are depicted in FIG. 1, two or more shielding covers may be applied to a single PCB.

Referring to FIG. 1, the shield can assembly 1 can include a PCB 4 including a ground line 41, two covers 2 and 3 electrically connected to the ground line 41 to shield electronic function groups 42 mounted on the PCB 4, and a fixing means for fixing the covers 2 and 3 on the PCB 4.

The ground line 41 formed or mounted on the PCB 4 is disposed to be exposed on a top surface of the PCB 4, and can be electrically connected to a ground portion of the PCB 4. The ground line 41 can include an enclosed portion corresponding to a rim of the two covers 2 and 3 disposed on the ground line 41. The ground line 41 can include a first region A for accommodating the electronic function group 42 in a closed shape, and a second region B for accommodating the electronic function group 42 in a closed shape. The first region A can be formed by a first ground line 411, and the second region B can be formed by a second ground line 412. In addition, the first ground line 411 and the second ground line 412 can be divided into the first region A and the second region B based on a boundary ground line 413.

The covers 2 and 3 can include the first cover 2 and the second cover 3. The two covers 2 and 3 can be used to split and shield the electronic function groups 42 mounted on the PCB 4.

The first cover 2 can be secured to shield the first region A of the PCB 4. The first cover 2 can be fixed to electrically connect to the first ground line 411 of the PCB 4 which defines the first region A with the first cover's 2 rim. The second cover 3 can be secured to shield the second region B of the PCB 4. The second cover 3 can be fixed to electrically connect to the second ground line 412 which defines the second region B with the second cover's 3 rim.

The first cover 2 can include a top surface 21 formed in at least the same size as the first region A, and a side surface 22 bending along the rim of the top surface 21 to a certain height. Hence, a space formed by the side surface 22 of the certain height from the top surface 21 can be used as an accommodation space for receiving the electronic function groups 42 when the first cover 2 is secured to the PCB 4.

The second cover 3 can include a top surface 31 formed in at least the same size as the second region B, and a side surface 32 bending along the rim of the top surface 31 to a certain height. Hence, a space formed by the side surface 32 of the certain height from the top surface 31 can be used as an accommodation space for receiving the electronic function groups 42 when the second cover 3 is secured to the PCB 4.

The first cover 2 and the second cover 3 can be formed of a metal material. For example, the first cover 2 and the second cover 3 can be formed of a conductive metal material such as SUS and aluminum. In this case, the top surfaces 21 and 31, the side surfaces 22 and 32, a tension protrusion 321, to be explained, can be formed integrally using pressing or injection molding.

The fixing means can employ a fixing clip 8 for tightly receiving the side surfaces 21 and 31 of the covers 2 and 3. The fixing clip 8 can be formed by bending a metal plate several times, and be fixed to the ground line 41 of the PCB 4. The fixing clip 8 can include a side insertion portion 81 with an open upper surface to tightly receive the side surfaces 21 and 31 of the covers 2 and 3. For example, at least one tension protrusion 321 formed in the side surface 32 of the covers 2 and 3 is press-fitted to a tension hole 82 of the side insertion portion 81 of the fixing clip 8, to thus securely fix the covers 2 and 3 to the PCB 4 without separation. For example, the fixing clip 8 can be formed of a metal material and secured to the ground line 411 of the PCB 4 using soldering or bonding.

For example, the fixing clip 8 may be mounted to the boundary ground line 413 which is the boundary of the first region A and the second region B. In this case, the fixing clip 8 can be applied to protrusion portions 23 and 33 including a closed end of the first cover 2 and the second cover 3. For example, when recess portions of the first cover 2 and the second cover 3 include the closed end, the fixing clip 8 may be applied to the corresponding recess portion. For example, when the recess portion and the protrusion portion of the first cover 2 and the second cover 3 share the closed end, the fixing clip 8 may be disposed to accommodate both of the first cover 2 and the second cover 3.

For example, the boundary ground line 413 of the PCB 4 can accommodate both of the two covers 2 and 3. The corresponding side surfaces 22 and 32 of the first cover 2 and the second cover 3 can face each other, and the facing portion can be received in the single boundary ground line 413. Such a structure is very advantageous to the space usage. The mounting space of the electronic function group can be extended or the total volume of the shield can assembly 1 can be reduced compared to the related art which applies the individual ground line corresponding to the covers 2 and 3 respectively. Thus, the device can be slimmed.

When the two shielding covers are adjacent and their corresponding side surfaces face each other in the related art, the facing portion of the covers has the boundary portion to a thickness corresponding to the sides of the two covers. By contrast, when the two covers face each other, the present disclosure has the boundary portion to the thickness corresponding to the single cover side, which is greatly advantageous.

For example, the facing boundary portion of the first cover 2 and the second cover 3 can be formed by alternating the protrusion portions 23 and 33 and the recess portions 24 and 34. Hence, the first cover 2 and the second cover 3 can be tightly coupled by facing and engaging each other at the same time. For example, when the protrusion portion 23 and the recess portion 24 are alternated in the first cover 2, the second cover 3 can alternate the corresponding recess portion 34 and the corresponding protrusion portion 33. Accordingly, the protrusion portion 33 of the second cover 3 is inserted to the recess portion 24 of the first cover 2 and the protrusion portion 23 of the first cover 2 is inserted to the recess portion 34 of the second cover 3 so that the first cover 2 and the second cover 3 tightly face each other without any separation.

For example, since the engaged portion of the protrusion portions 23 and 33 and the recess portions 24 and 34 of the first cover 2 and the second cover 3 is electrically connected with the boundary ground line 413 of the PCB 4, the single cover thickness can realize the width of the boundary ground line 413.

For example, when the protrusion portions 23 and 33 and the recess portions 24 and 34 of the first cover 2 and the second cover 3 face each other, at least one corresponding portion can be formed as a closed end to easily separate the first region A and the second B 2. Since the protrusion portions 23 and 33 and the recess portions 24 and 34 of the first cover 2 and the second cover 3 clearly separate the first region A and the second region B, the separate boundary ground line 413 may not be formed.

Figure 2:
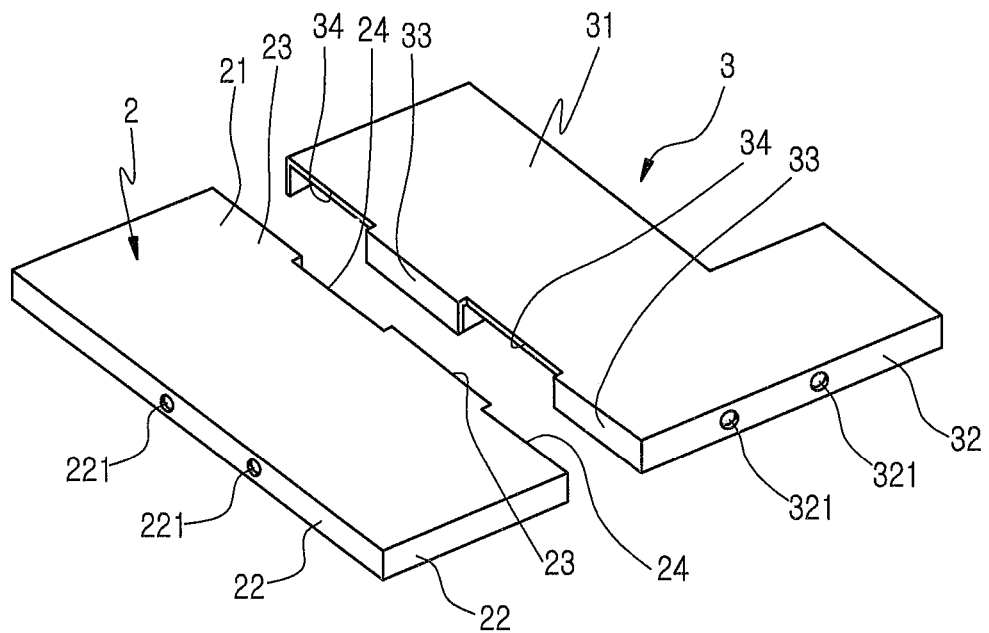
FIG. 2 illustrates a perspective view of covers of FIG. 1 according to an exemplary embodiment of the present disclosure.
Figure 3:
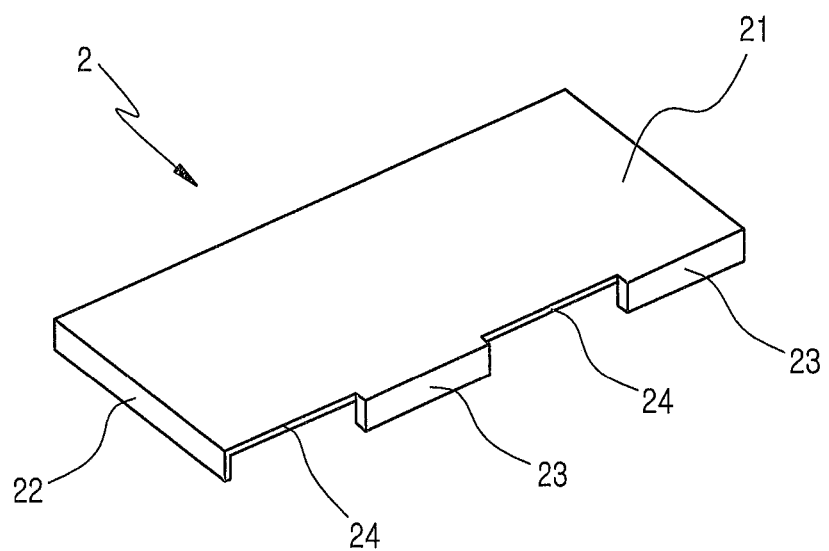
FIG. 3 illustrates a perspective view of a first cover of FIG. 1, which is taken from a different angle, according to an exemplary embodiment of the present disclosure.

FIG. 2 illustrates a perspective view of the covers of FIG. 1 according to an exemplary embodiment of the present disclosure, and FIG. 3 illustrates a perspective view of the first cover of FIG. 1, which is taken from a different angle, according to an exemplary embodiment of the present disclosure.

Referring to FIGS. 2 and 3, the first cover 2 can include a pair of the protrusion portions 23 spaced from each other at a certain distance, and a pair of the recess portions 24 between the protrusion portions 23. Likewise, the second cover 3 can include a pair of the recess portions 34 spaced from each other at a certain distance, and a pair of the protrusion portions 33 between the recess portions 33.

For example, the protrusion portion 23 of the first cover 2 can correspond to the recess portion 34 of the second cover 3, and the recess portion 24 of the first cover 2 can correspond to the protrusion portion 33 of the second cover 3. The protrusion portion 23 of the first cover 2 and the protrusion portion 33 of the second cover 3 can bend and protrude to have the closed end. The recess portion 24 of the first cover 2 and the recess portion 34 of the second cover 3 can form an open end. Hence, when the protrusion portions 23 and 33 and the recess portions 24 and 34 of the first cover 2 and the second cover 3 are engaged, the closed end of the protrusion portions 23 and 33 of the first cover 2 and the second cover 3 can shield and separate the electronic function group receiving space of the first cover 2 and the electronic function group receiving space of the second cover 3.

For example, the recess portions 24 and 34 of the first cover 2 and the second cover 3 may include the closed end, and the corresponding protrusion portions 23 and 33 of the first cover 2 and the second cover 3 may include the closed end. For example, both of the recess portion 24 and the protrusion portion 23 of the first cover 2 may include the closed end, and both of the recess portion 34 and the protrusion portion 33 of the second cover 3 may include the open end. For example, it is advantageous that at least one of the recess portion 24 or the protrusion portion 23 of the first cover 2 and the protrusion portion 33 or the recess portion 34 of the second cover 3 includes the closed end.

Figure 4:
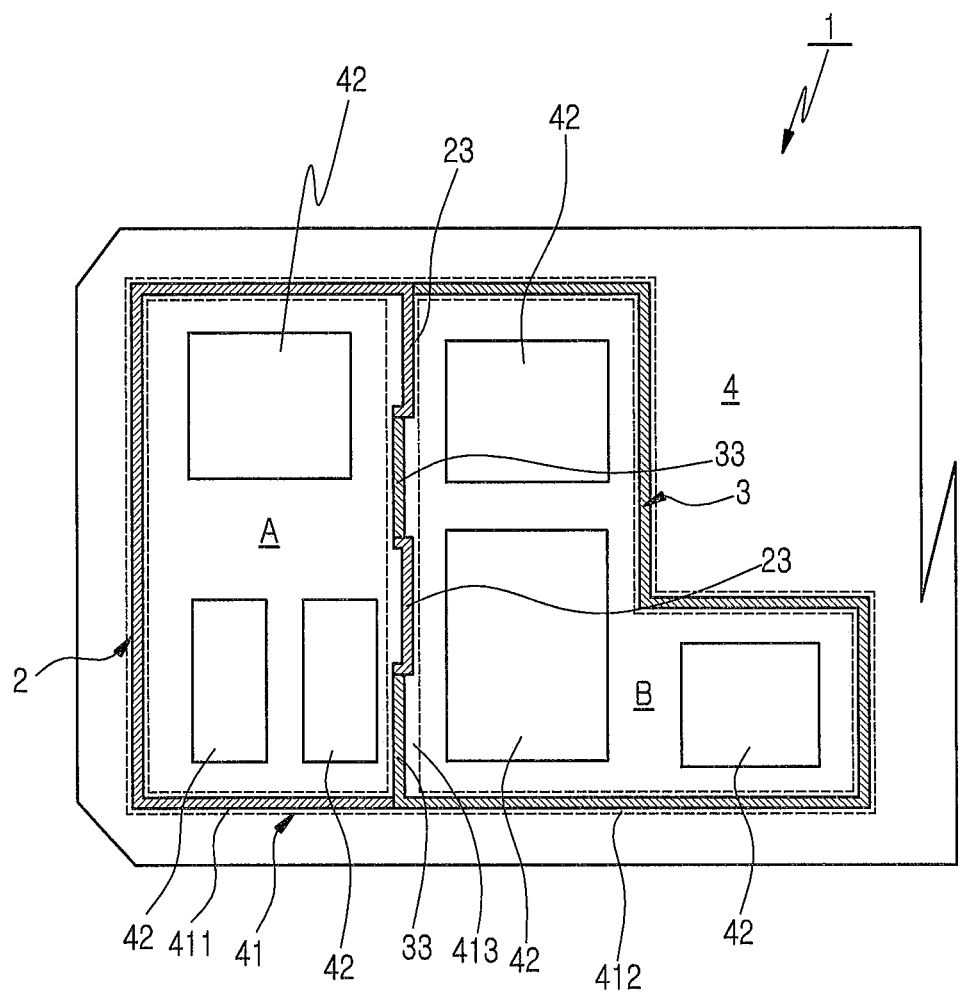
FIG. 4 illustrates a plane view of the shield can assembly of FIG. 1 fastened to a PCB according to an exemplary embodiment of the present disclosure.

FIG. 4 illustrates a plane view of the shield can assembly of FIG. 1 fastened to the PCB according to an exemplary embodiment of the present disclosure.

Referring to FIG. 4, to separate and shield the electronic function groups 42 on the PCB 4, the first cover 2 and the second cover 3 for the shielding can be applied. In so doing, the PCB 4 can be divided by the ground line 41 into two regions, and the electronic function groups 42 can be mounted in the regions A and B. The ground line 41 includes the first ground line 411 for closing along the side surface of the first cover 2, the second ground line 412 for closing along the side surface of the second cover 3, and the boundary ground line 413 for separating the first region A and the second region B. The boundary ground line 413 can be formed along the facing portion of the first cover 2 and the second cover 3.

For example, the protrusion portions 23 of the first cover 2 and the protrusion portions 33 of the second cover 3 can engage and face each other. In so doing, since the protrusion portions 23 and 33 of the covers 2 and 3 are the closed ends, the closed ends of the protrusion portions 23 and 33 can be connected along the boundary ground line 413 without ceasing as shown in FIG. 4. Thus, the first region A and the second region B can be completely separated along the boundary ground line 413.

When the first cover 2 and the second cover 3 face each other, their facing portions are engaged to thus result in no wide boundary width including the thickness of the both covers 2 and 3. For example, the facing portion of the first cover 2 and the second cover 33 can realize the thickness of the single cover by virtue of their engaging structure.

Figure 5:
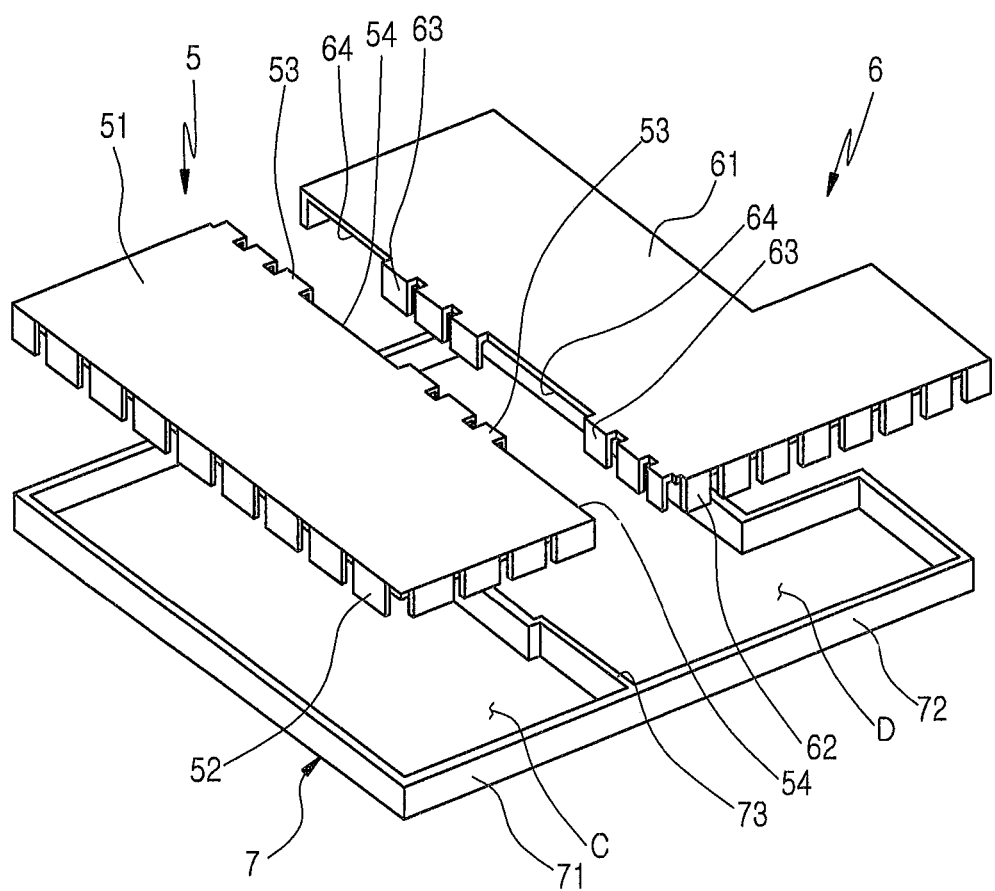
FIG. 5 illustrates an exploded view of the shield can assembly according to various exemplary embodiments of the present disclosure.

FIG. 5 illustrates an exploded view of the shield can assembly according to various exemplary embodiments of the present disclosure.

For example, the shield can assembly may be realized as a frame fixing type. The PCB including the ground line is substantially the same as in FIG. 1 and thus shall be omitted here.

Referring to FIG. 5, the shield can assembly 6 can include a frame 7 fixed on the PCB at a certain height, and a first cover 5 and a second cover 6 secured on the frame 7. It is advantageous that the frame 7 is formed of a metal material in the same shape as the ground line of the PCB, and secured to the ground line. The frame 7 can be secured to electrically connect with the ground line of the PCB using the bonding or the soldering.

For example, the frame 7 can include a first frame 71 including a first region C for accommodating the electronic function groups, a second frame 72 including a second region D for accommodating the electronic function groups, and a boundary frame 73 for separating the first region C and the second region D. The frames 71, 72, and 73 can be integrally formed. For example, the first frame 71 and the second frame 72 may be separated from each other. In this case, the boundary frame 73 may be separated at an adequate position and integrally formed with the first frame 71 and the second frame 72.

When the frames are separated based on their region, the first and second frames 71 and 72 and the first and second covers 5 and 6 may be mounted on the PCB all together after spreading a resin. Such a structure is very advantageous to the process efficiency compared to the related art which mounts the frame on the PCB and then assembles the cover on them. For example, the boundary frame 73 can alternate, but not limited to, a receiving groove for receiving protrusion portions 53 and 63 of the first cover 5 and the second cover 6 at regular intervals. The boundary frame 73 may be formed in a straight-line shape.

The first cover 5 can include a top surface 51, and a plurality of tension ribs 52 bending from the top surface 51 and formed in a certain height at regular intervals along a rim of the top surface 51. The tension rib 52 can secure the first cover 5 by contacting an outer side surface of the first frame 71. The tension rib 52 includes a protrusion (not shown) and the first frame 71 includes a protrusion receiving groove (not shown) at a corresponding position. Hence, the protrusion is inserted to the protrusion receiving groove so that the first cover 5 is supported and secured by the first frame 71.

The second cover 6 can include a top surface 61, and a plurality of tension ribs 62 bending from the top surface 61 and formed in a certain height at regular intervals along a rim of the top surface 61. The tension rib 62 can secure the second cover 6 by contacting an outer side surface of the second frame 72. The tension rib 62 includes a protrusion (not shown) and the second frame 72 includes a protrusion receiving groove (not shown) at a corresponding position. Hence, the protrusion is inserted to the protrusion receiving groove so that the second cover 6 is supported and secured by the second frame 72.

For example, the first cover 5 and the second cover 6 can be disposed to face each other. The protrusion portion 53 and the recess portion 54 can be alternated in the portion of the first cover 5 facing the second cover 6, and the protrusion portion 63 and the recess portion 64 can be alternated in the portion of the second cover 6 facing the first cover 5. Likewise, the protrusion portions 53 and 63 and the recess portions 54 and 64 of the first cover 5 and the second cover 6 can be disposed and engaged at the corresponding positions. That is, the protrusion portion 63 can be formed at the position of the second cover 6 corresponding to the recess portion 54 of the first cover 5, and the recess portion 54 of the first cover 5 and the protrusion portion 63 of the second cover 6 can be engaged. The recess portion 64 can be formed at the position of the second cover 6 corresponding to the protrusion portion 53 of the first cover 5, and the protrusion portion 53 of the first cover 5 and the recess portion 64 of the second cover 6 can be engaged.

For example, the protrusion portions 53 and 63 of the first cover 5 and the second cover 6 can be formed as a plurality of tension ribs spaced at regular intervals. The protrusion portions 53 and 63 of the first cover 5 and the second cover 6 can bend in the same fashion as the tension ribs 52 and 62 formed on the side surface of the first cover 5 and the second cover 6.

Figure 6:
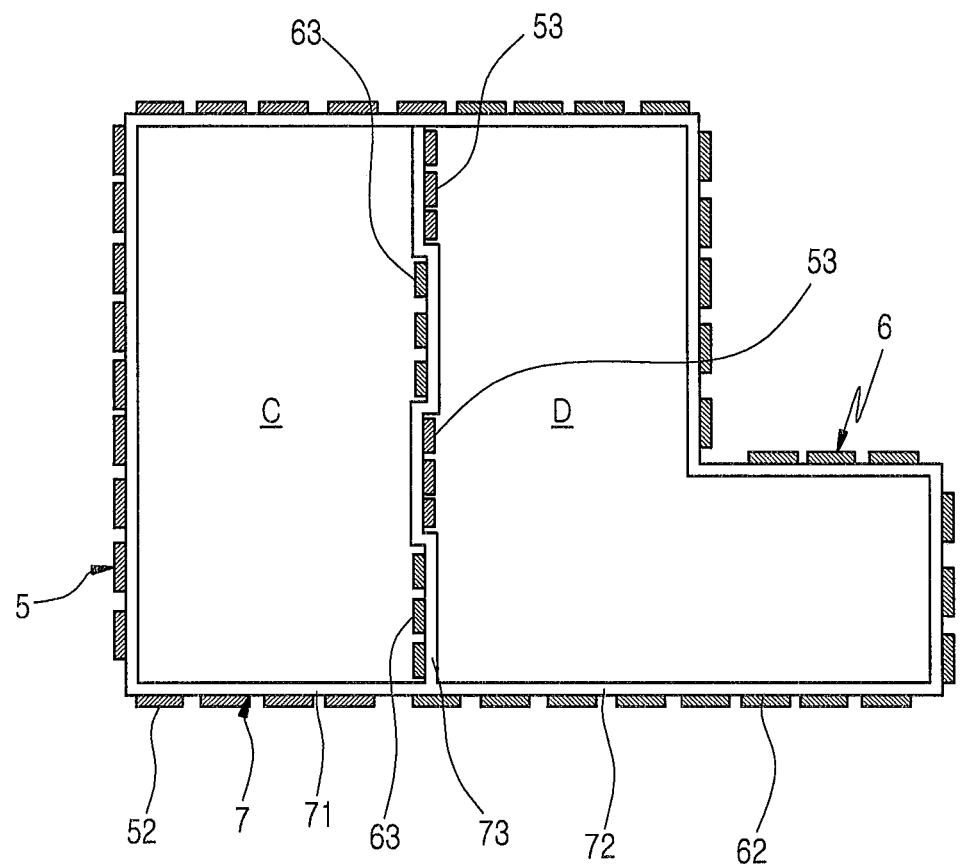
FIG. 6 illustrates a cross-sectional view of covers of FIG. 5 fastened to the PCB using a frame according to an exemplary embodiment of the present disclosure.

FIG. 6 illustrates a cross-sectional view of the covers of FIG. 5 fastened to the PCB using the frame according to an exemplary embodiment of the present disclosure.

Referring to FIG. 6, the frame 7 of the certain height can be mounted on the PCB. The frame 7 includes the first frame 71 for creating the first region C to mount the electronic function groups and to receive the first cover 5, and the second region D for mounting the electronic function groups and receiving the second cover 6. The boundary frame 73 can be formed to isolate the first region C and the second region D.

For example, the first cover 5 can be disposed on the first frame 71 and then secured to the first frame 5 with a certain pressure. For example, the tension ribs 52 serving as the side surface of the first cover 5 can be tightly contacted and secured to the outer surface of the first frame 5. Likewise, the second cover 6 can be disposed on the second frame 72 and then secured to the second frame 72 with a certain pressure. For example, the tension ribs 62 serving as the side surface of the second cover 6 can be tightly contacted and secured to the outer surface of the second frame 6.

For example, the protrusion portions 53 and 63 of the first cover 5 and the second cover 6 can be engaged with the corresponding recess portions 54 and 64 to face each other. Thus, the protrusion portion 53 of the first cover 5 can be secured toward the second region being the outer surface of the boundary frame 73, and the protrusion portion 63 of the second cover 6 can be secured toward the first region being the outer surface of the boundary frame 73.

For example, although the tension ribs 52 and 62 of the covers 5 and 6 and the protrusion portions 53 and 63 of the first and second covers 5 and 6 include the tension ribs, the side surface of each region is shielded already by the frame 7 due to the certain height. Thus, the first region C and the second region D can function as the complete shielding space thanks to the top surfaces of the first cover 5 and the second cover 6.

As set forth above, since at least two shielding covers share the single boundary region, the component mounting region of the PCB can be efficiently utilized to thus contribute to the slimness of the electronic device.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a printed circuit board (PCB) including a first region and a second region, wherein the second region is adjacent to the first region along a boundary between the first and second regions;
    a first electronic element disposed in the first region;
    a second electronic element disposed in the second region;
    a first cover configured to shield the first electronic element;
    a second cover configured to shield the second electronic element, the second cover disposed adjacent to the first cover along the boundary between the first and second regions; and
    a plurality of fixing means each configured to fix one of the first cover or the second cover on the PCB, the plurality of fixing means disposed on the PCB around a periphery of the first cover and the second cover except for a portion of the PCB corresponding to the boundary between the first and second covers,
    wherein at least a first portion of the first cover is configured to be fitted into at least a first portion of the second cover,
    wherein at least a second portion of the second cover is configured to be fitted into at least a second portion of the first cover,
    wherein the first and second covers form an electronic shield along the boundary configured to shield the first electronic element and the second electronic element, and
    wherein the at least first portion of the first cover and the at least second portion of the second cover are the only electronic shield between the first and second regions.

2. The electronic device of claim 1, wherein:
    at least the first portion of the first cover includes at least one of a protrusion portion and a recess, and
    at least the first portion of the second cover includes at least one of a protrusion portion and a recess having sizes and shapes corresponding to sizes and shapes of the protrusion portion and the recess of the first cover.

3. The electronic device of claim 2, wherein corresponding boundary portions of the first cover and the second cover comprise at least one protrusion portion and at least one recess portion, respectively, which are fitted together face each other.

4. The electronic device of claim 1, wherein the first cover and the second cover have at least one common ground portion.

5. The electronic device of claim 3, wherein at least one of the protrusion portions of the first cover and the second cover is formed to have a closed end.

6. The electronic device of claim 3, wherein the first cover and the second cover, when fitted together, comprise:
a top surface in a size corresponding to at least the first region and the second region; and
a side surface bending along a rim of the top surface to a certain height,
wherein at least one side surface of the first and second covers is fitted in the boundary portion.

7. The electronic device of claim 3, further comprising:
a ground line exposed in a top surface of the PCB and having a width to form the boundary corresponding to rims of the first and second regions.

8. The electronic device of claim 7, wherein the fixing means are secured on the ground line and collectively fix the first cover and the second cover to the PCB.

9. The electronic device of claim 8, wherein the fixing means are fixing clips which are disposed at regular intervals on the ground line and wherein each of the fixing clips comprises a side insertion portion for receiving a side surface of one of the first cover or the second cover in a press-fit manner.

10. An electronic device comprising:
a first cover disposed on a first region of a printed circuit board (PCB);
a second cover disposed on a second region of the PCB, the second cover disposed adjacent to the first cover along a boundary between the first and second regions; and
a plurality of fixing means each configured to fix one of the first cover or the second cover on the PCB, the plurality of fixing means disposed on the PCB around a periphery of the first cover and the second cover except for a portion of the PCB corresponding to the boundary between the first and second covers,
wherein boundary portions of the first cover and the second cover comprise at least one protrusion portion and at least one recess portion, respectively, which are fitted together,
wherein the first and second covers form an electronic shield along the boundary configured to shield electronic elements in the first and second regions respectively, and
wherein the at least one protrusion portion of the first cover and at least one protrusion portion of the second cover are the only electronic shield between the first and second regions.

11. The electronic device of claim 10, wherein:
a portion of the first cover facing the second cover is formed by alternating one or more protrusion portions and one or more recess portions at regular intervals, and
a portion of the second cover facing the first cover is formed by alternating one or more recess portions and one or more protrusion portions to be fitted with the one or more protrusion portions and the one or more recess portions of the first cover, respectively, at corresponding positions.

12. The electronic device of claim 11, wherein at least one of the one or more protrusion portions of the first cover and the second cover is formed to have a closed end.

13. An electronic device comprising:
a PCB including a plurality of electronic function groups;
a first cover configured to shield one of the electronic function groups that is located in a first region of the PCB;
a second cover configured to shield another one of the electronic function groups that is located in a second region of the PCB, the second cover disposed adjacent to the first cover along a boundary between the first and second regions; and
a plurality of fixing means each configured to fix one of the first cover or the second cover on the PCB, the plurality of fixing means disposed on the PCB around a periphery of the first cover and the second cover except for a portion of the PCB corresponding to the boundary between the first and second covers,
wherein boundary portions of the first cover and the second cover comprise at least one protrusion portion and at least one recess portion, respectively, which are fitted together,
wherein the first and second covers form an electronic shield along the boundary configured to shield the electronic function groups in the first and second regions, respectively, and
wherein the at least one protrusion portion of the first cover and at least one protrusion portion of the second cover are the only electronic shield between the first and second regions.

14. The electronic device of claim 13, wherein:
a portion of the first cover facing the second cover is formed by alternating one or more protrusion portions and one or more recess portions at regular intervals, and
a portion of the second cover facing the first cover is formed by alternating one or more recess portions and one or more protrusion portions to be fitted with the one or more protrusion portions and the one or more recess portions of the first cover, respectively, at corresponding positions.

15. The electronic device of claim 14, wherein any one of the one or more protrusion portions of the first cover and the second cover is formed to have a closed end.

16. An electronic device comprising:
a printed circuit board (PCB) configured to mount a plurality of electronic function groups;
a first region configured to accommodate part of the electronic function groups;
a second region having at least a boundary portion with the first region, the second region configured to accommodate part of the electronic function groups;
a boundary line defining the first region and the second region and electrically connected to a ground of the PCB;
a first cover of a metal material, at least a portion of the first cover disposed on the boundary line, the first cover configured to shield the first region;
a second cover of a metal material mounted material, at least a portion of the second cover disposed on the boundary line, the second cover configured to shield the second region; and
a plurality of fixing means of a conductive material, each of the fixing means configured to secure one of the first cover or the second cover to the first region and the second region, respectively, the plurality of fixing means disposed on the PCB around a periphery of the first cover and the second cover except for a portion of the PCB corresponding to the boundary line between the first and second covers,
wherein boundary portions of the first cover and the second cover comprise at least one protrusion portion and at least one recess portion, respectively, which are fitted together, wherein the first and second covers form an electronic shield along the boundary line configured to shield the electronic function groups in the first and second regions, respectively, and wherein the at least one protrusion portion of the first cover and at least one protrusion portion of the second cover the only electronic shield between the first and second regions.

17. The electronic device of claim 1, wherein when the first and second covers are fitted together along the boundary between the first region and a second region, the first and second covers form the electronic shield along the boundary configured to shield the electronic elements in the first and second regions, respectively.

18. The electronic device of claim 10, wherein when the first and second covers are fitted together along the boundary between the first region and a second region, the first and second covers form the electronic shield along the boundary configured to shield electronic elements in the first and second regions, respectively.

19. The electronic device of claim 13, wherein when the first and second covers are fitted together along the boundary between the first region and a second region, the first and second covers form the electronic shield along the boundary configured to shield electronic elements in the first and second regions, respectively.

20. The electronic device of claim 16, wherein when the first and second covers are fitted together along the boundary line between the first region and a second region, the first and second covers form the electronic shield along the boundary line configured to shield electronic elements in the first and second regions, respectively.

21. An electronic device comprising:
a printed circuit board (PCB) including a first region and a second region, wherein the second region is adjacent to the first region along a boundary between the first and second regions;
a first electronic element disposed in the first region;
a second electronic element disposed in the second region;
a first cover configured to shield the first electronic element; and
a second cover configured to shield the second electronic element, wherein at least a first portion of the first cover is configured to be fitted into at least a first portion of the second cover, wherein at least a second portion of the second cover is configured to be fitted into at least a second portion of the first cover, and wherein when the first and second covers are fitted together along the boundary between the first region and the second region, the first and second covers form an electronic shield along the boundary configured to shield the electronic elements in the first and second regions, respectively, wherein the at least first portion of the first cover and the at least second portion of the second cover are the only electronic shield between the first and second regions, and wherein the electronic shield comprises the at least first portion of the first cover and the at least second portion of the second cover.

22. An electronic device comprising:
a first cover disposed on a first region of a printed circuit board (PCB); and
a second cover disposed on a second region of the PCB having at least a boundary with the first region, wherein when the first and second covers are fitted together along the boundary between the first region and the second region, the first and second covers form an electronic shield along the boundary configured to shield electronic elements in the first and second regions, respectively, wherein boundary portions of the first cover and the second cover comprise at least one protrusion portion of the first cover and at least one recess portion of the second cover, respectively, which are fitted together, wherein the electronic shield comprises the at least one protrusion portion of the first cover and at least one protrusion portion of the second cover, and wherein the at least one protrusion portion of the first cover and the at least one protrusion portion of the second cover are the only electronic shield between the first and second regions.

* * * * *